United States Patent
Baek et al.

(10) Patent No.: US 7,892,385 B2
(45) Date of Patent: Feb. 22, 2011

(54) ADHESIVE MEMBER AND METHOD OF MANUFACTURING DISPLAY DEVICE USING THE SAME

(75) Inventors: Seung-Jin Baek, Seoul (KR); Wang-Su Hong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 269 days.

(21) Appl. No.: 11/701,804

(22) Filed: Feb. 1, 2007

(65) Prior Publication Data

US 2007/0175582 A1  Aug. 2, 2007

(30) Foreign Application Priority Data

Feb. 2, 2006 (KR) .................. 10-2006-0010086

(51) Int. Cl.
- B29C 65/48 (2006.01)
- B32B 37/02 (2006.01)
- B32B 37/06 (2006.01)
- B32B 37/12 (2006.01)
- B32B 38/10 (2006.01)
- B32B 37/26 (2006.01)
- C09J 5/06 (2006.01)
- B29C 65/18 (2006.01)
- B29C 65/56 (2006.01)

(52) U.S. Cl. .............. 156/249; 156/230; 156/247; 156/289; 156/308.2; 156/322; 428/1.1; 428/40.1; 428/41.8

(58) Field of Classification Search ............... 156/230, 156/247, 249, 289, 308.2, 322; 428/1.1, 428/40.1, 41.8
See application file for complete search history.

(56) References Cited

U.S. PATENT DOCUMENTS

| 6,848,488 B2 * | 2/2005 | Choo et al. ............ 156/521 |
| 6,939,729 B2 * | 9/2005 | Iwafuchi et al. ........ 438/22 |
| 2003/0024635 A1 * | 2/2003 | Utsunomiya ......... 156/272.2 |
| 2003/0189754 A1 * | 10/2003 | Sugino et al. ......... 359/485 |
| 2005/0225711 A1 | 10/2005 | Kim |
| 2006/0098154 A1 * | 5/2006 | Kim et al. ............ 349/187 |

FOREIGN PATENT DOCUMENTS

| EP | 1386950 A1 * | 2/2004 |
| JP | 03005718 A * | 1/1991 |
| JP | 7-325297 | 12/1995 |
| JP | 07325297 A * | 12/1995 |

(Continued)

OTHER PUBLICATIONS

Patent Abstracts of Japan, Publication No. 07-325297, Dec. 12, 1995, 1 p.

(Continued)

*Primary Examiner*—Philip C Tucker
*Assistant Examiner*—Sonya Mazumdar
(74) *Attorney, Agent, or Firm*—Innovation Counsel LLP

(57) ABSTRACT

An adhesive member for a display device is provided. The adhesive member includes first and second adhesive layers, and coating layers. The first and second adhesive layers have different adherence characteristics. Each of the coating layers covers the first and second adhesive layer, respectively. The adherence of the second adhesive layer is stronger than that of the first adhesive layer.

10 Claims, 8 Drawing Sheets

FOREIGN PATENT DOCUMENTS

| | | | |
|---|---|---|---|
| JP | 8-86993 | | 4/1996 |
| JP | 08086993 A | * | 4/1996 |
| JP | 2001-209059 | | 8/2001 |
| JP | 2002-214588 | | 7/2002 |
| JP | 2002214588 A | * | 7/2002 |
| JP | 2002-365614 | | 12/2002 |
| JP | 2003-68995 | | 3/2003 |
| JP | 2003068995 A | * | 3/2003 |
| JP | 2004269679 A | * | 9/2004 |
| JP | 2005-85830 | | 3/2005 |
| KR | 10-2004-0079827 | | 9/2004 |
| KR | 2005041464 A | * | 5/2005 |
| KR | 10-2005-0096562 | | 10/2005 |
| WO | WO 2006133744 A1 | * | 12/2006 |

OTHER PUBLICATIONS

Patent Abstracts of Japan, Publication No. 08-086993, Apr. 2, 1996, 1 p.
Patent Abstracts of Japan, Publication No. 2001-209059, Aug. 3, 2001, 1 p.
Patent Abstracts of Japan, Publication No. 2002-214588, Jul. 31, 2002, 1 p.
Patent Abstracts of Japan, Publication No. 2002-365614, Dec. 18, 2002, 1 p.
Patent Abstracts of Japan, Publication No. 2003-068995, Mar. 7, 2003, 1 p.
Patent Abstracts of Japan, Publication No. 2005-085830, Mar. 31, 2005, 1 p.
Korean Patent Abstracts, Publication No. 1020040079827, Sep. 16, 2004, 1 p.
Korean Patent Abstracts, Publication No. 1020050096562, Oct. 6, 2005, 1 p.

* cited by examiner

ADHESIVE MEMBER AND METHOD OF MANUFACTURING DISPLAY DEVICE USING THE SAME

CROSS-REFERENCE TO RELATED APPLICATION

This application claims priority to and the benefit of Korean Patent Application No. 10-2006-0010086 filed in the Korean Intellectual Property Office on Feb. 2, 2006, the entire contents of which are incorporated herein by reference.

BACKGROUND OF THE INVENTION (a) Field of the Invention

The present invention relates to an adhesive member and a method of manufacturing a display device using the same.

(b) Description of the Related Art

A liquid crystal display and an organic light emitting diode (OLED) display are representative examples of widely used flat panel displays.

A liquid crystal display generally includes an upper panel on which a common electrode and color filters are formed, a lower panel on which thin film transistors and pixel electrodes are formed, and a liquid crystal layer interposed between the two display panels. An electric field is generated by a potential difference across the pixel electrode and common electrode, and the direction of liquid crystal molecules is determined by the electric field. Since the transmittance of incident light is determined depending on the arrangement direction of the liquid crystal molecules, desired images can be displayed by adjusting the potential difference between two electrodes.

An OLED display includes a hole injection electrode (anode), an electron injection electrode (cathode), and an organic emission layer formed between the anode and the cathode, and it is a self-illuminating display device to emit light while recombining holes injected from the anode and electrons injected from the cathode and becoming extinct in the organic emission layer.

This display device is unsuitable for a large screen and to maintain portability because it uses a glass substrate that is heavy and fragile. Therefore, a display device that is light and strong and that uses a flexible plastic substrate has been recently developed.

However, since the plastic substrate can bend or expand when high-temperature heat is applied thereto, it is difficult to accurately form thin film patterns such as electrodes or signal lines on it.

Accordingly, in order to overcome the above problem, the technical subject of the present invention is to provide an adhesive member that can attach a supporting substrate to a plastic substrate accurately and that can be easily removed, and a method of manufacturing a display device using the adhesive member.

SUMMARY OF THE INVENTION

The present invention has been made in an effort to provide an adhesive member that can attach a supporting substrate to a plastic substrate accurately and that can be easily removed, and a method of manufacturing a display device using the adhesive member.

An exemplary embodiment of the present invention provides an adhesive member for a liquid crystal display including a first adhesive layer, a second adhesive layer adhered directly on the first adhesive layer, and a coating layer for covering the first adhesive layer and the second adhesive layer. The adherence of the second adhesive layer is stronger than that of the first adhesive layer.

The first adhesive layer may include an acryl-based resin.

The second adhesive layer may include a silicon-based resin.

The adherence of the first adhesive layer may be stronger than a predetermined reference value in a temperature range of about 20° C. to 50° C., and weaker than the predetermined reference value in a temperature range of about −10° C. to 5° C.

The adherence of the second adhesive layer may be maintained stronger than the predetermined reference value in a temperature range of about −10° C. to 150° C.

A method of manufacturing a liquid crystal display according to an exemplary embodiment of the present invention includes removing a first coating layer of an adhesive member that includes a first adhesive layer and a second adhesive layer, the first coating layer and a second coating layer covering the first adhesive layer and the second adhesive layer, respectively; disposing the first adhesive layer on one side of a flexible substrate and laminating the adhesive member on the flexible substrate as a first lamination process; removing the second coating layer of the adhesive member that is adhered to the flexible substrate; contacting a supporting substrate to the second adhesive layer and laminating the adhesive member to the supporting substrate as a second lamination process; forming a plurality of thin films on the other side of the flexible substrate; and removing the adhesive member from the flexible substrate on which the plurality of thin films are formed.

The first lamination process may be a process to pressurize the flexible substrate and the adhesive member and attach them to each other by rolling rollers respectively disposed on the top and bottom of the flexible substrate and the adhesive member in opposite rotation directions to each other and in the same direction.

In the first lamination process, the temperature of the rollers may be maintained in the range of about 20° C. to 50° C.

The second lamination process may be a process to pressurize the supporting substrate and the adhesive member and attach them to each other by rolling rollers respectively disposed on the top and bottom of the supporting substrate and the adhesive member in opposite rotation directions to each other and in the same direction.

In the removing of the adhesive member from the flexible substrate, the flexible substrate may be cooled.

In the cooling of the flexible substrate, the flexible substrate may be cooled to a temperature of about −10° C. to 5° C.

The thin film may include a gate line having a gate electrode, a gate insulating layer formed on the gate line, a semiconductor layer formed on a predetermined region of the gate insulating layer, a data line formed on the gate insulating layer and the semiconductor layer and including a source electrode, a drain electrode separated from the source electrode by a predetermined distance to face the source electrode, and a pixel electrode formed on the data line and the drain electrode and connected to the drain electrode through a contact hole in a passivation layer.

The thin film may include a light blocking member formed on a substrate, a color filter formed on the substrate, and a common electrode formed on the substrate.

DETAILED DESCRIPTION OF THE EMBODIMENTS

Figure 1:
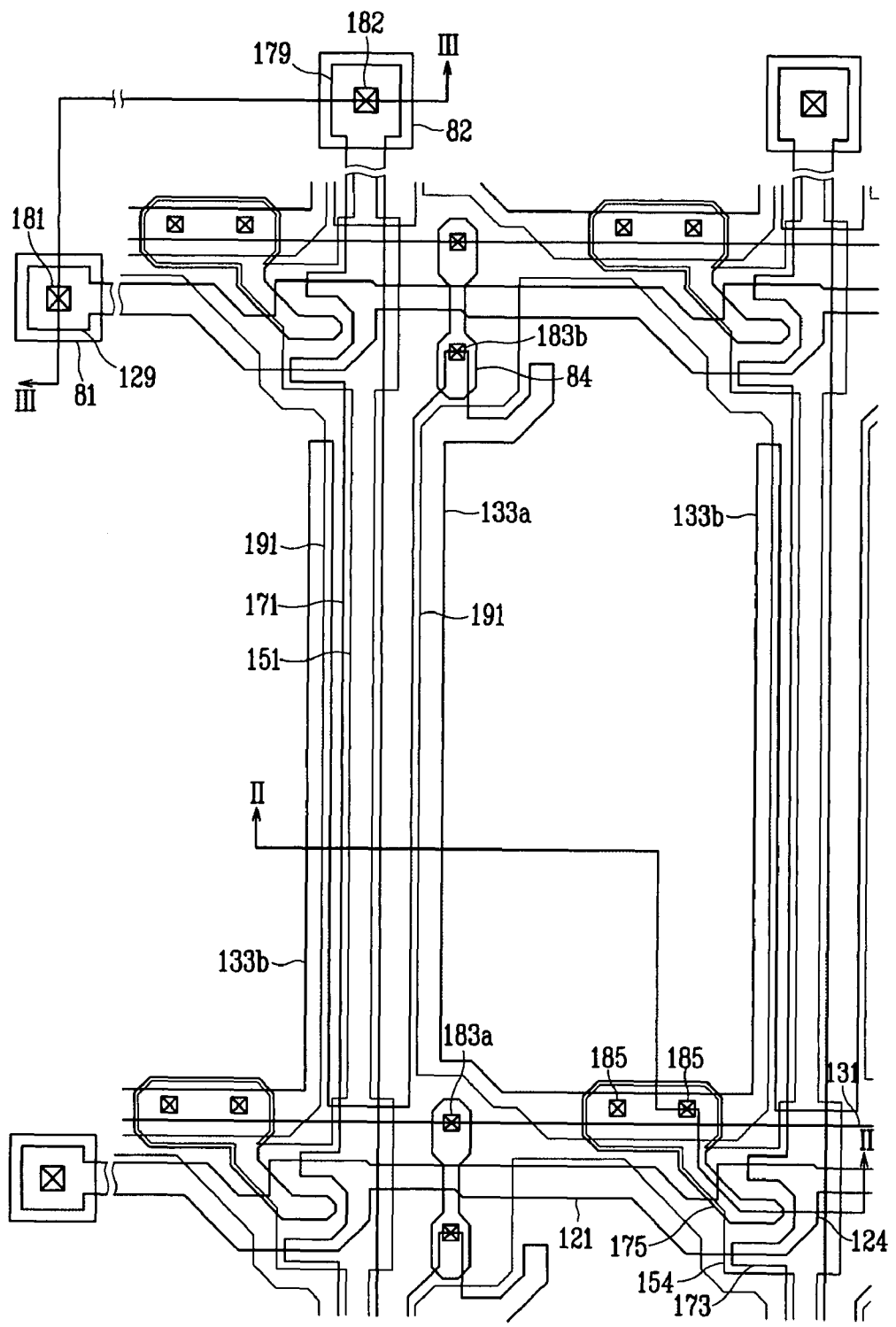
FIG. 1 is a layout view of a liquid crystal display according to an exemplary embodiment of the present invention.

An exemplary embodiment of the present invention will hereinafter be described in detail with reference to the accompanying drawings in order that those skilled in the art can easily practice the invention.

As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A liquid crystal display according to an exemplary embodiment of the present invention will now be described in detail with reference to FIG. 1 to FIG. 3.

Figure 2:
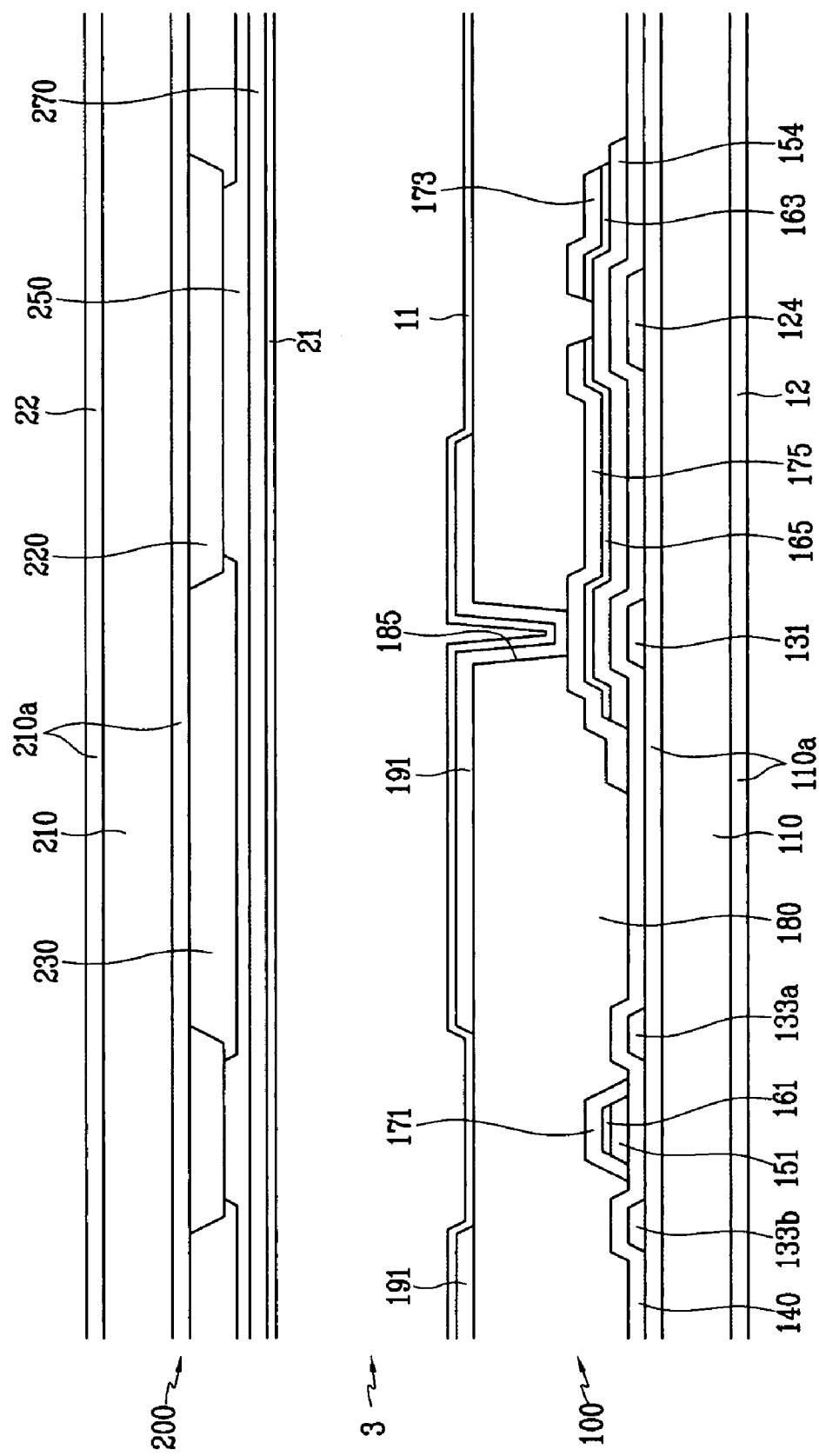
FIG. 2 and FIG. 3 are cross-sectional views of a liquid crystal display taken along lines II-II and III-III of FIG. 1, respectively.
Figure 3:
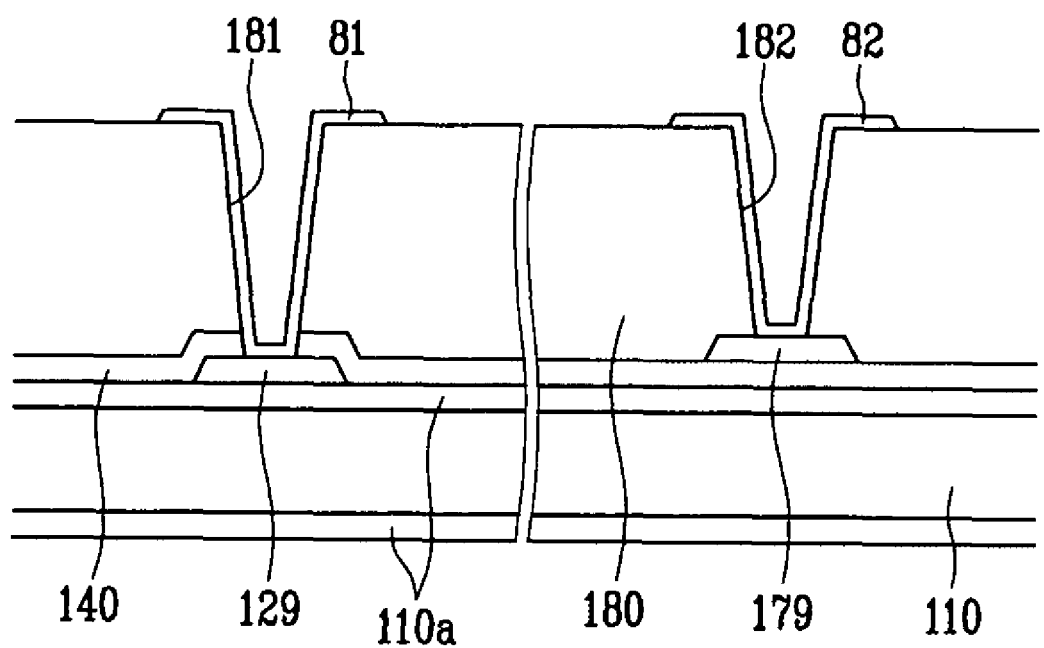

FIG. 1 is a layout view of a liquid crystal display according to an exemplary embodiment of the present invention, and FIG. 2 and FIG. 3 are cross-sectional views of a thin film transistor array panel taken along lines II-II and III-III of FIG. 1, respectively.

A plurality of gate lines 121 and a plurality of storage electrode lines 131 are formed on a flexible substrate 110 made of plastic or the like.

A protection layer 110a is disposed on the both surfaces of the substrate 110. The protection layer 110a prevents oxygen or water from passing from the outside into the substrate to protect a thin film transistor that will be formed later. The protection layer 110a may be made of silicon oxide ($Si_xO_y$) or silicon nitride ($Si_xN_y$). The protection layer 110a may be formed on only one surface of the substrate 110, or may be omitted.

The gate lines 121 transfer gate signals and extend basically in a horizontal direction. The gate lines 121 includes a plurality of gate electrodes 124 that are protruded downward and wide ends 129 for connecting with other layers or external driving circuits. A gate driving circuit (not shown) for generating a gate signal may be mounted on a flexible printed circuit film (not shown) attached to the substrate 110 or mounted directly on the substrate 110, or may be integrated on the substrate 110. If the gate driving circuit is integrated on the substrate 110, it may be directly connected to the gate lines 121.

The storage electrode lines 131 receive a predetermined voltage and have trunk lines extending to run almost parallel to the gate lines 121, and a plurality of pairs of first and second storage electrodes 133a and 133b branching off from the trunk lines. Each of the storage electrode lines 131 is disposed between two adjacent gate lines 121, and its trunk line is placed closer to the lower one of the two adjacent gate lines 121. Each of storage electrodes 133a and 133b has a fixed end connected to the trunk line and a free end opposite to the fixed end. The fixed end of the first storage electrode 133a has a wide area, and the free end is divided into two portions, a straight portion, and a bent portion. However, the shape and disposition of the storage electrode lines 131 may be variously changed.

A gate insulating layer 140 is formed on the gate lines 121 and the storage electrode lines 131 that are made of silicon nitride ($Si_xN_y$) or silicon oxide ($Si_xO_y$).

A plurality of semiconductor stripes 151 made of hydrogenated amorphous silicon (a-Si) or polysilicon are formed on the gate insulating layer 140. The semiconductor stripes 151 extend mainly in a vertical direction and have a plurality of projections 154 that protrude toward the gate electrodes 124. The semiconductor stripes 151 become wider around the gate lines 121 and the storage electrode lines 131 so as to cover them.

A plurality of ohmic contact stripes 161 with protrusions 163 and ohmic contact islands 165 are formed on the semiconductors 151. The ohmic contacts 161, 163, and 165 may be made of silicide or n+ hydrogenated amorphous silicon in which an n-type impurity such as phosphorus is highly doped.

A plurality of data lines 171 and a plurality of drain electrodes 175 are formed on the ohmic contacts 161, 163, and 165 and the gate insulating layer 140.

The data lines 171 transfer data signals and extend mainly in a vertical direction to cross the gate lines 121. The data lines 171 cross the storage electrode lines 131 to run between the sets of adjacent storage electrodes 133a and 133b. The data lines 171 have a plurality of U-shaped source electrodes 173 extending toward the gate electrodes 124 and rotating in a counter-clockwise direction by 90 degrees, and wide ends 179 for connecting with other layers or external driving circuits. A data driving circuit (not shown) for generating the data signals may be mounted on a flexible printed circuit film (not shown) attached to the substrate 110 or mounted directly on the substrate 110, or may be integrated on the substrate 110. If the data driving circuit is integrated on the substrate 110, it may be directly connected to the data lines 121.

The drain electrodes 175 are separated from the data lines 171 and face the source electrodes 173 with the gate electrodes 124 interposed therebetween. Each of the drain electrodes 175 has one wide end and one rod-shaped end. The wide end is connected to the pixel electrode 191 through a contact hole 185, and the rod-shaped end is partially surrounded by the source electrode 173.

A thin film transistor (TFT) consists of one gate electrode 124, one source electrode 173, and one drain electrode 175 together with the projection 154 of the semiconductor 151, and the channel of the TFT is formed on the projection 154 between the source electrode 173 and the drain electrode 175.

The ohmic contacts 161, 163, and 165 are disposed only between the semiconductors 151 and the data lines 171 and drain electrodes 175 to reduce contact resistance between them.

A passivation layer 180 is formed on the data lines 171 and drain electrodes 175, and on exposed regions of the semiconductors 154. The passivation layer 180 is made of an inorganic insulator or an organic insulator, and its surface may be flat.

A plurality of contact holes 182 and 185 are formed on the passivation layer 180 to expose the ends 179 of the data lines 171 and the drain electrodes 175, respectively. Also, a plurality of contact holes 181, a plurality of contact holes 183a, and a plurality of contact holes 183b are formed on the passivation layer 180 and the gate insulating layer 140 to expose the ends 129 of the gate lines 121, parts of the storage electrode lines 131 around the fixed ends of the first storage electrodes 133a, and protrusions of the free ends of the first storage electrodes 133a, respectively.

A plurality of pixel electrodes 191, a plurality of overpasses 84, and a plurality of contact assistants 81 and 82 are formed on the passivation layer 180. They may be made of a transparent conductive material such as indium tin oxide (ITO) or indium zinc oxide (IZO), or a reflective metal such as aluminum, silver, chromium, and alloys thereof.

The pixel electrodes 191 are physically and electrically connected to the drain electrodes 175 through the contact holes 185 and receive data voltages from the drain electrodes 175. The pixel electrodes 191 on which a data voltage is applied generate electric fields together with common electrodes 270 of a display panel 200 to which a common voltage is applied so as to determine the direction of liquid crystal molecules (not shown) of the liquid crystal layer 3 between the two electrodes. The polarization of light that passes through the liquid crystal layer varies depending on the determined direction of the liquid crystal molecules. The pixel electrodes 191 and the common electrodes 270 form capacitors (hereinafter, referred to as liquid crystal capacitors) to maintain the applied voltage even after the thin film transistor is turned off.

The pixel electrodes 191 and the drain electrodes connected to the pixel electrodes 191 are overlapped with the storage electrodes 133a and 133b and the storage electrode lines 131. Capacitors formed by overlapping the pixel electrodes 191 and the drain electrodes 175 electrically connected to the pixel electrodes 191 with the storage electrode lines 131 are called storage capacitors, and the storage capacitors enhance the voltage maintaining ability of the liquid crystal capacitors.

The contact assistants 81 and 82 are connected to the end 129 of the gate line 121 and the end 179 of the data line 171 through the contact holes 181 and 182, respectively. The contact assistants 81 and 82 supplement the connectivity of the ends 129 of the gate line 121 and the ends 179 of the data line 171 with external devices, and protect them.

The overpasses 84 are laid across the gate lines 121 and connected to the exposed portions of the storage electrode lines 131 and the exposed free ends of the storage electrodes 133b through the contact holes 183a and 183b disposed on the opposite side with the gate lines 121 placed therebetween.

The storage electrodes 133a and 133b and the storage electrode lines 131 may be used together with the overpasses 84 to correct defects of the gate lines 121, the data lines 171, or the thin film transistor.

The color filter display panel 200 will now be described with reference to FIG. 2 and FIG. 3.

A light blocking member 220 is formed on a flexible substrate 210 made of plastic or the like.

A protection layer 210a is disposed on the both surfaces of the substrate 210. The protection layer 210a prevents oxygen or water from passing from the outside into the substrate 210 to protect a thin film transistor that will be formed later. The protection layer 210a may be made of silicon oxide ($Si_xO_y$) or silicon nitride ($Si_xN_y$). The protection layer 210a may be formed on only one surface of the substrate 110, or may be omitted.

The light blocking member 220 is also called a black matrix. The light blocking member 220 defines a plurality of openings that face the pixel electrodes 191 and have the same shape as the pixel electrodes 191, blocking light leakage from between the pixel electrodes 191. The light blocking member 220 may consist of one portion corresponding to the gate lines 121 and the data lines 171 and another portion corresponding to the thin film transistor.

A plurality of color filters 230 are formed on the substrate 210, and are disposed to be almost contained into the openings surrounded by the light blocking member 220. The color filters 230 may extend along the column of the pixel electrodes 191 in a vertical direction to form stripes. Each of the color filters 230 may display one of primary colors such as three primary colors, red, green, and blue.

An overcoat 250 is formed on the color filters 230 and the light blocking member 220. The overcoat 250 made of an (organic) insulator prevents the color filters 230 from being exposed and provides a flat surface. The overcoat 250 may be omitted.

A common electrode 270 is formed on the overcoat 250. The common electrode 270 is made of a transparent conductor such as ITO or IZO.

Alignment layers (not shown) are applied on the inner surfaces of the display panels 100 and 200, and they may be a horizontal alignment layer or a vertical alignment layer. Polarizers (not shown) are provided on the outer surfaces of the display panels 100 and 200. The polarization axes of two polarizers are perpendicular to each other, and it is desirable that one of the two polarization axes runs parallel to the gate lines 121. In the case of a reflective liquid crystal display, one of the two polarizers may be omitted.

The liquid crystal display according to the present exemplary embodiment may further include a phase retardation film (not shown) for compensating for the delay of the liquid crystal layer. In addition, the liquid crystal display may further include a backlight unit (not shown) for providing the polarizers, phase retardation film, display panels 100 and 200, and liquid crystal layer 3 with light.

Hereinafter, a method of manufacturing a liquid crystal display will be described with reference to FIG. 1 to FIG. 3.

Figure 4:
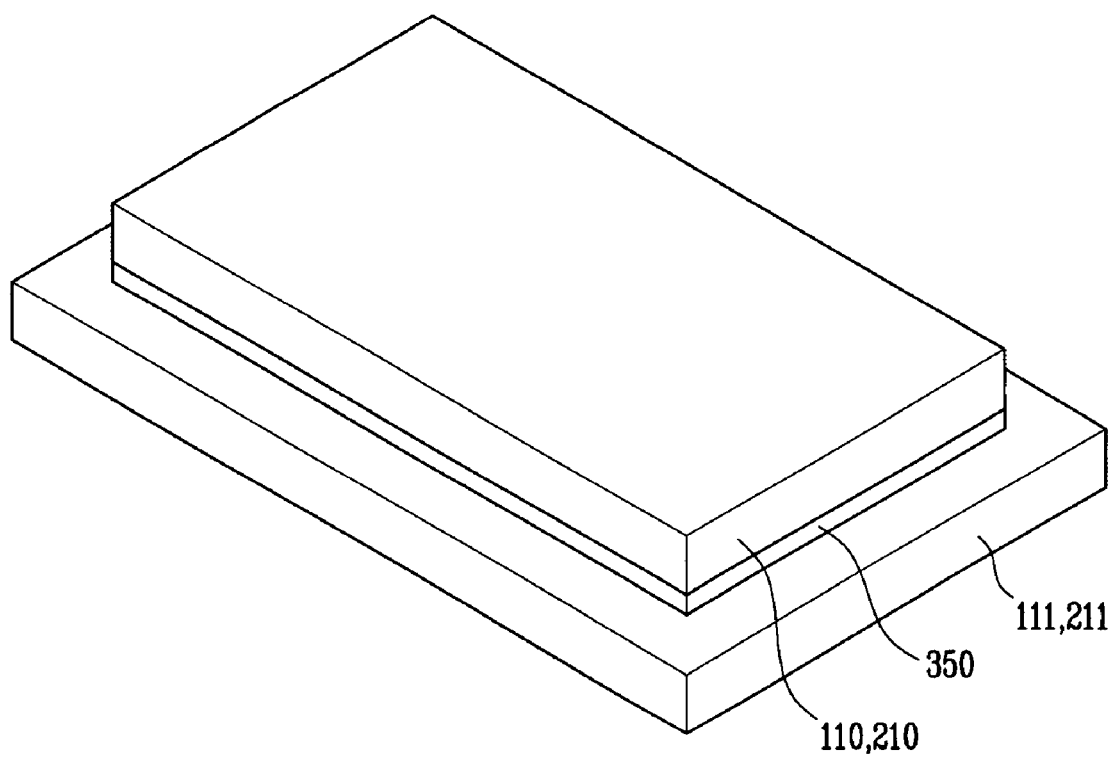
FIG. 4 shows a supporting substrate with a plastic substrate attached.

At first, in order to form a plurality of thin films on a substrate 110/210 made of plastic or the like, as shown in FIG. 4, the plastic substrate 110/210 are attached to a supporting substrate 111/211 made of glass or the like. FIG. 4 shows the supporting substrate with the plastic substrate attached. At this time, an adhesive member 350 is used to fix the plastic substrate 110/210 to the supporting substrate 111/211.

The supporting substrate 111/211 prevents transformation of the plastic substrate 110/210 in the process of forming a thin film pattern, to allow accurate forming of the thin film pattern. The supporting substrate 111/211 is removed from the plastic substrate 110/210 after completely forming a desired thin film on the plastic substrate 110/210.

The process of manufacturing the thin film on the plastic substrate 110/210 may be performed at a high temperature. Therefore, it requires the adhesive member 350 to firmly adhere the supporting substrate 111/211 to the plastic substrate 110/210 such that it does not come off the plastic substrate 110/210 even at a high temperature, and can be clearly and entirely removed with no damage to the plastic substrate 110/210 and with no remainder after completely forming the desired thin film.

Figure 5:
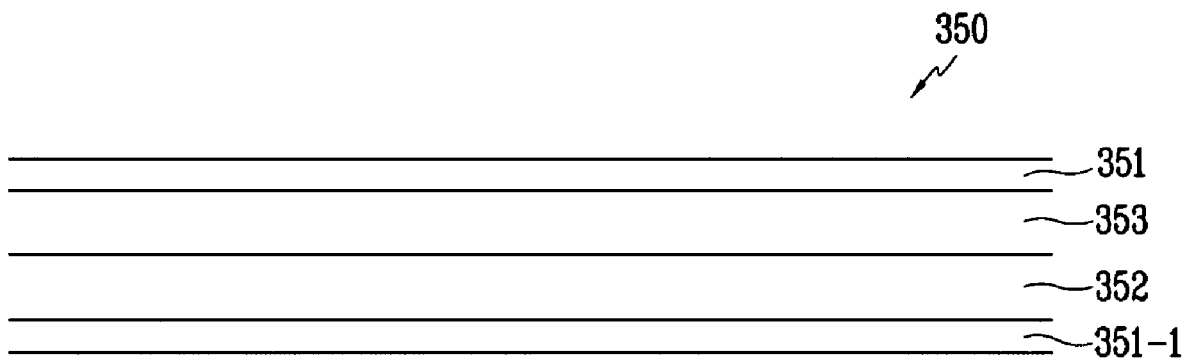
FIG. 5 is a cross-sectional view of an adhesive member for a liquid crystal display according to an exemplary embodiment of the present invention.

An adhesive member for a liquid crystal display according to an exemplary embodiment of the present invention will now be described with reference to FIG. 5. FIG. 5 shows the layered structure of an adhesive member for a liquid crystal display according to an exemplary embodiment of the present invention.

Referring to FIG. 5, the adhesive member 350 for a liquid crystal display according to the present embodiment is a stacked layer formed by sequentially stacking a coating layer 351, the first adhesive layer 352, the second adhesive layer 353, and a coating layer 351 again.

Coating layers 351 and 351-1 protect the first and second adhesive layers 352 and 353 and prevent undesired contact with structures before are used in the invention. Coating layers 351 and 351-1 are removed from the first and second adhesive layers 352 and 353 before attaching the adhesive layers 352 and 353 to the plastic substrate 110/210 and the supporting substrate 111/211.

The first and second adhesive layers 352 and 353 of the adhesive member for a liquid crystal display according to an embodiment of the present invention are described below with reference to the following Table 1.

Table 1 shows experimental results related to the characteristics of the first and second adhesive layers 352 and 353 in the adhesive member for a liquid crystal display according to an embodiment of the present invention.

TABLE 1

|  | First adhesive layer 352 | Second adhesive layer 353 |
|---|---|---|
| Constitution material | Acryl-based resin | Silicon-based resin |
| Exfoliation strength (peel strength) | 13.3-2.2 N/25 mm | 70-150 N/25 mm |
| Layer thickness | 25 μm | 25 μm |
| Major characteristics | 1) Loss of adherence at lower than −5° C. | 1) Sustains high adherence at −10° C. to 150° C. |
|  | 2) has superior adherence at 20° C. to 50° C. |  |

As shown in Table 1, the first adhesive layer 352 in the adhesive member for a liquid crystal display according to an exemplary embodiment of the present invention includes an acryl-based resin. The first adhesive layer 352 has a high level of adherence in the temperature range from about 20° C. to 50° C. In contrast, the relative adherence of the first adhesive layer 352 becomes weakened at a low temperature, for example about −10° C. to 5° C.

Also, the second adhesive layer 353 includes a silicon-based resin, and has stronger adherence than that of the first adhesive layer 352. Unlike the first adhesive layer 352, it is preferable that the second adhesive layer 353 sustain a high level of adherence at temperatures in range of −10° C. to 150° C.

There is no interlayer interposed between the first adhesive layer 352 and the second adhesive layer 353 in the adhesive member for a liquid crystal display according to an exemplary embodiment of the present invention. Therefore, the plastic substrate 110/210 adhered to the adhesive member is not transformed, for example by coming off or bending because of expansion and contraction of an interlayer during a high temperature process. Since the first adhesive layer 352 is directly adhered to the second adhesive layer 353 with no interlayer in the adhesive member according to an exemplary embodiment of the present invention, the adherence of the adhesive member is the strongest between the first adhesive layer 352 and the second adhesive layer 353, is the second strongest between the second adhesive layer 353 and the coating layer 351, and is the weakest between the first adhesive layer 352 and the coating layer 351-1.

A method of manufacturing a liquid crystal display using an adhesive member according to an exemplary embodiment of the present invention will now be described with reference to FIG. 6A to FIG. 6E.

FIG. 6A to FIG. 6E sequentially show a method of manufacturing a liquid crystal display according to an exemplary embodiment of the present invention.

Figure 6A:
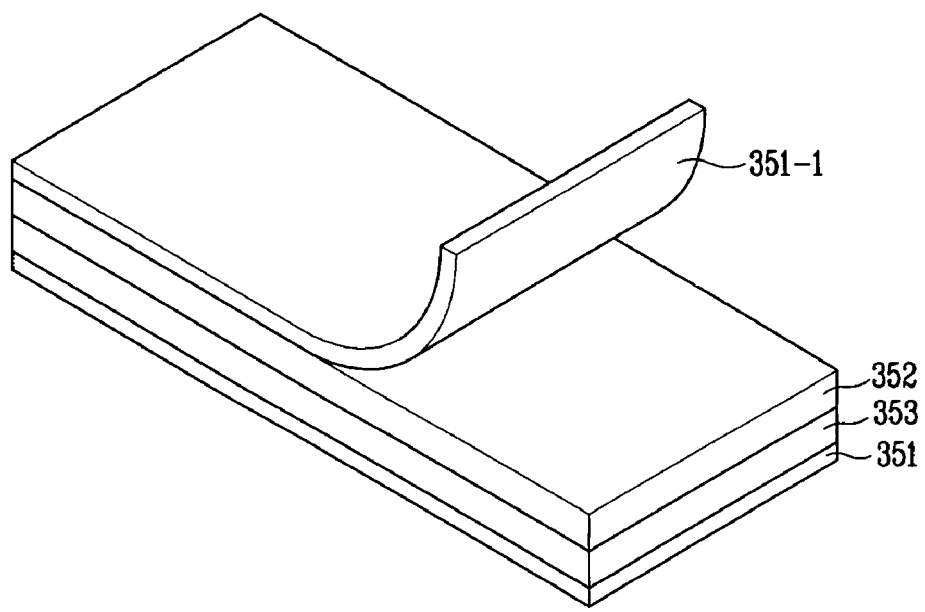
FIG. 6A to FIG. 6F show a method of manufacturing a liquid crystal display according to an exemplary embodiment of the present invention.

First, as shown in FIG. 6A, coating layer 351-1 attached to the first adhesive layer 352 of an adhesive member 350 according to an exemplary embodiment of the present invention is removed.

Figure 6B:
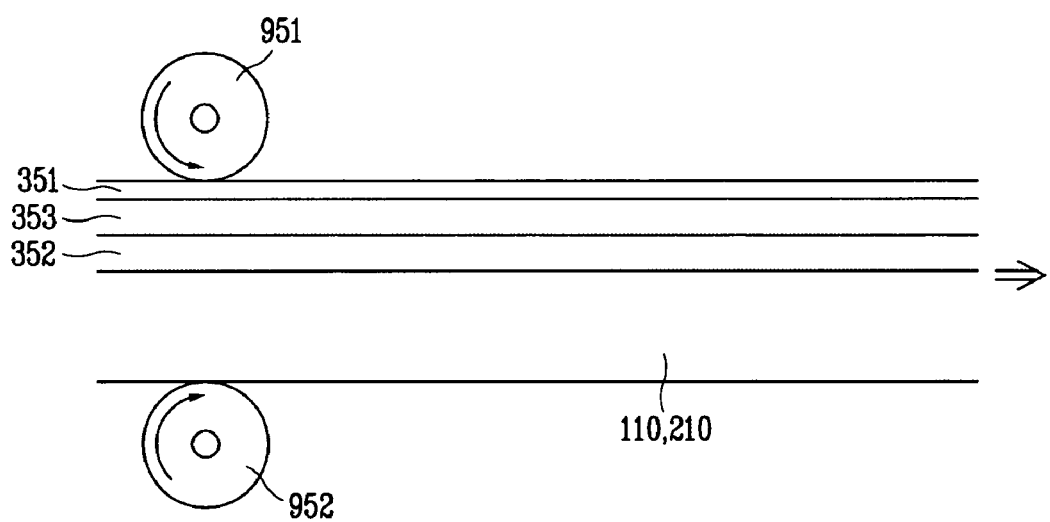

After removing the coating layer 351-1, the first adhesive layer 352 is adhered to the plastic substrate 110/210 through a lamination process. Herein, as shown in FIG. 6B, the first adhesive layer 352 of the adhesive member 350 is disposed on the plastic substrate 110/210, and the first adhesive layer 352 and the plastic substrate 110/210 are pressed together while rolling rollers 951 and 952 disposed at the top and bottom of the substrate 110 and 210 in opposite rotation directions to each other, that is, in the small arrow directions, and moving the rollers 951 and 952 in the large arrow direction.

It is preferable that the temperature of the roller 951 disposed on the plastic substrate 110/210 is about 20° C. to 50° C. As described above, the first adhesive layer 352 of the adhesive member according to an exemplary embodiment of the present invention has superior adherence in the temperature range of about 20° C. to 50° C. Thus, when the roller 951 having a temperature of about 20° C. to 50° C. is used, the adherence of the first adhesive layer 352 improves, and the adhesive member 350 is easily adhered to the plastic substrate 110/210.

Figure 6C:
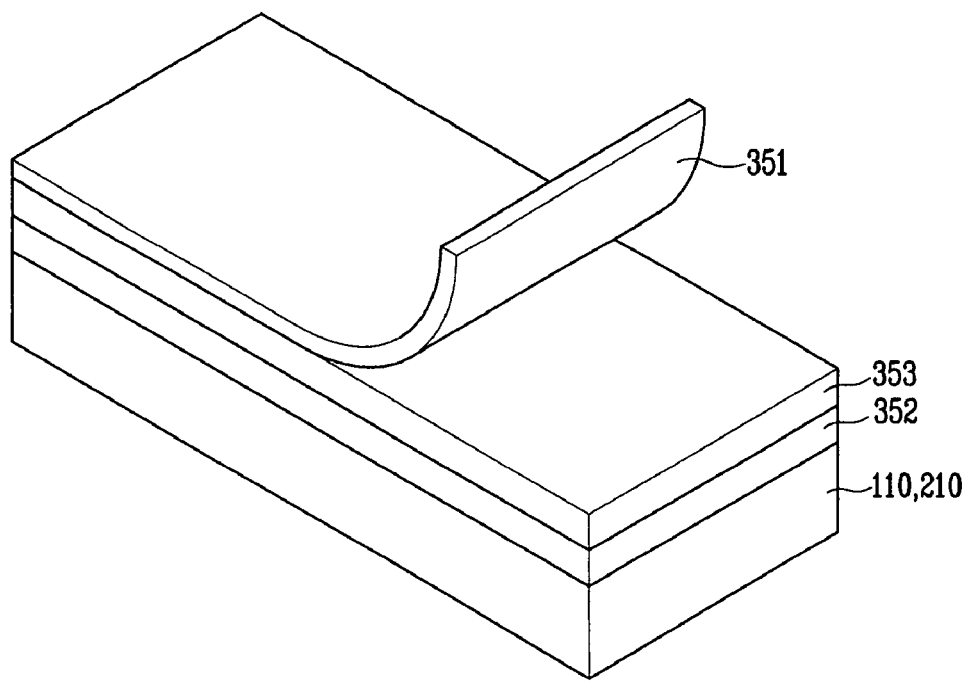
Figure 6D:
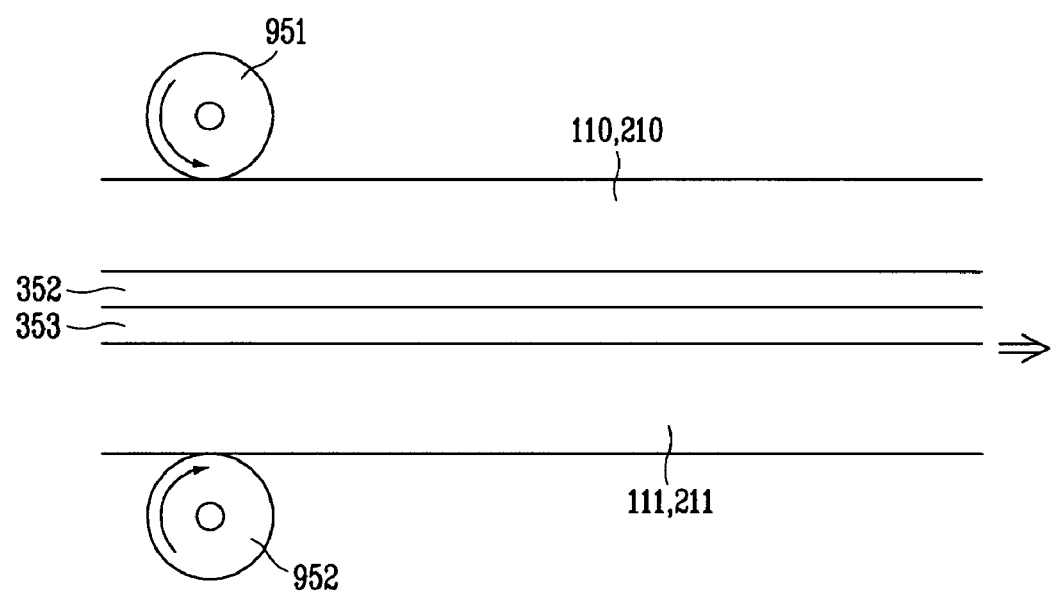

As shown in FIG. 6C, coating layer 351 adhered to second adhesive layer 353 is removed. Then as shown in FIG. 6D, second adhesive layer 353 is laminated on the supporting substrate 111/211 as shown in FIG. 6D. At this time, the second adhesive layer 353 of the adhesive member 350 is disposed directly on the supporting substrate 111/211, and the second adhesive layer 353 and the supporting substrate 111/211 are pressurized while rolling the rollers 951 and 952 in opposite rotation directions while moving the rollers 951 and 952 in one direction.

Figure 6E:
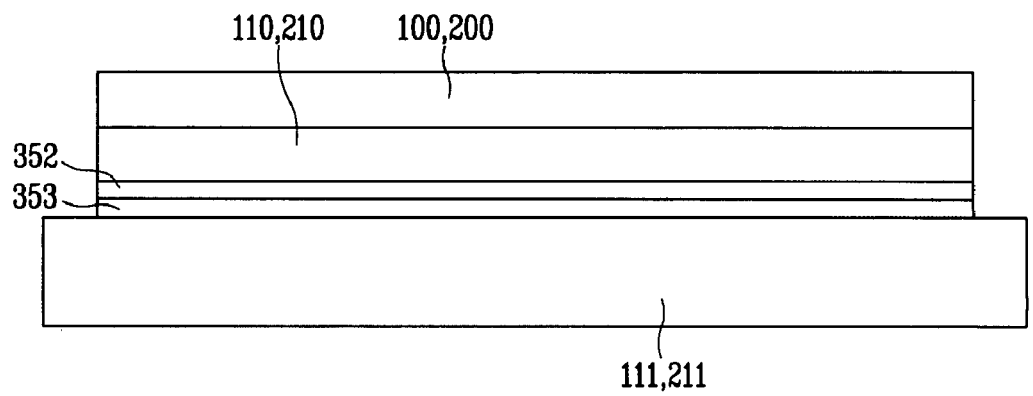

Referring to FIG. 6E, a desired thin film 100/200 is formed on the plastic substrate 110/210 attached to the supporting substrate 111/211.

A method of forming the thin film 100 will now be described with reference to FIG. 1 to FIG. 3. Referring to FIG. 1 to FIG. 3, gate lines 121 having gate electrodes 124 and ends 129, and storage electrode lines 131 having storage electrodes 133a and 133b, are formed on a flexible substrate 110. At this time, the pattern of the gate lines 121 and the storage electrode lines 131 is formed by depositing a metal layer through a sputtering process, coating a photosensitive film or laminating a photosensitive film thereafter, and performing a photolithography process.

Then, the gate insulating layer 140 is deposited, and an intrinsic semiconductor stripe 151 having a protrusion 154, and an impurity semiconductor stripe 161, are formed on the gate insulating layer 140. At this moment, the intrinsic semiconductor stripe 151 and the impurity semiconductor stripe 161 are formed by depositing the gate insulating layer 140 through a sputtering process, stacking the semiconductor layers through a chemical vapor deposition (CVD) process on the gate insulating layer 140, coating a photosensitive film or laminating a photosensitive film, and performing a photosensitive process.

Then, like the gate lines 121 and the storage electrode lines 131, a plurality of data lines 171 having source electrodes 173 and ends 179, and a plurality of drain electrodes 175, are formed by depositing a metal layer through a sputtering process, coating a photosensitive film or laminating a photosensitive film, and performing a photolithography process.

Consecutively, a plurality of ohmic contact stripes 161 having protrusions 163 and a plurality of ohmic contact islands 165 are formed by removing the exposed regions of the impurity semiconductor stripe 161, which is not covered by the data line 171 and the drain electrode 175 from the impurity semiconductor stripe 161. Also, the intrinsic semiconductor stripe 151 thereunder is exposed.

Then, a passivation layer 180 is deposited, and the passivation layer is patterned with the gate insulation layer 140 so as to form a plurality of contact holes 181, 182, 183a, 183b, and 185 in the passivation layer 180 and the gate insulating layer 140 to expose the ends 129 of gate lines 121, the ends 179 of data lines 171, the predetermined regions of storage electrode lines 131 around the fixed end of the first storage electrode 133a, a predetermined protruded portion in the free end of the first storage electrode 133a, and a drain electrode 175, respectively. In this case, the contact holes 181, 182, 183a, 183b, and 185 are formed by depositing the passivation layer 180 through a sputtering process, laminating a photosensitive film on a substrate 110 on which the passivation layer 180 is formed, and performing a photolithography process.

Then, a plurality of pixel electrodes 191, a plurality of contact assistants 81 and 82, and a plurality of overpasses 84 are formed by forming a transparent conductive layer by depositing ITO or IZO, coating a photosensitive film on the transparent conductive layer with a laminated photosensitive film, and performing a photolithography process.

Finally, an alignment layer 11 is coated on the thin film 100.

A method of forming the thin film 200 on the flexible substrate 210 will now be described. Referring to FIG. 1 and FIG. 2, a light blocking member 220 is formed on the flexible substrate 210.

The light blocking member 220 is patterned by stacking an opaque metal on a light blocking layer, coating a photosensitive film on the light blocking layer or laminating a photosensitive film, and performing a photolithography process.

Then, color filters 230 are formed on an opening made of the light blocking member 220, an overcoat 250 is stacked on the color filters 230, and a common electrode 270 including ITO or IZO is formed on the overcoat 250 through sputtering.

Finally, an alignment layer 21 is applied on the thin film 200.

Figure 6F:
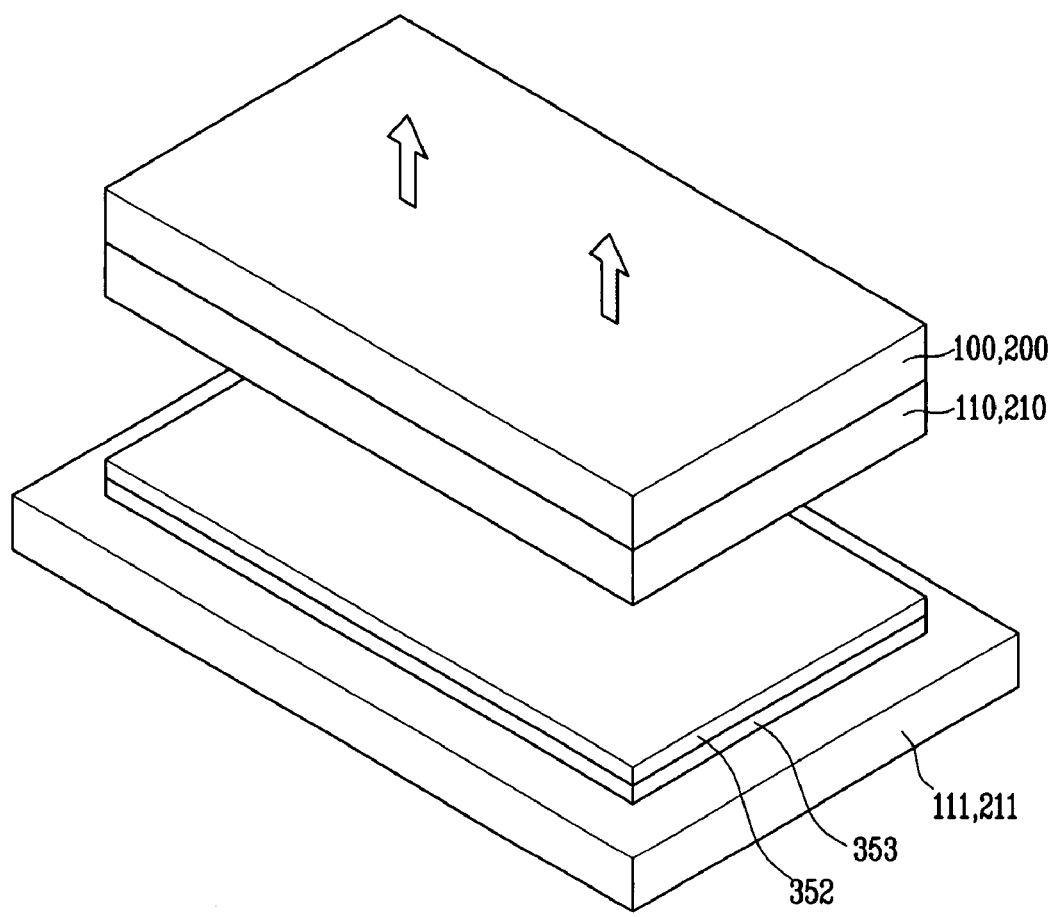

Referring to FIG. 6F, the plastic substrate 110/210 adhered to the supporting substrate 111/211 having the thin film 100/200 through the adhesive member 350 is separated from the supporting substrate 111/211.

Herein, the plastic substrate 110/210 having the thin film 100/200 is cooled at a temperature of less than about 5° C., and more specifically, about −20° C. to about 5° C. When the substrate 110/210 is cooled as described above, the adherence of the second adhesive layer 353 in the adhesive member 350 according to an exemplary embodiment of the present invention barely changes, and the relative adherence of the first adhesive layer 352 is weakened and it is lower than the adherence value of second adhesive layer 353. Since the adherence of the first adhesive layer 352 becomes weakened and the first adhesive layer 352 adhered to the second adhesive layer 353 has a relatively strong adherence, the plastic substrate 110/210 adhered to the other side of the first adhesive layer 352 is easily removed.

As described above, the plastic substrates 110/210 that are respectively separated from the adhesive member 350 and the supporting substrates 111/211 are assembled to face each other, and a liquid crystal layer 3 (FIG. 2) is injected to complete the manufacture of a liquid crystal display.

As described above, since the adhesive member 350 according to an exemplary embodiment of the present invention includes the first and second adhesive layers 352 and 353 that have different adherences and adherence characteristics that vary with temperature with no interlayer included, the plastic substrate 110/210 attached to the adhesive member does not come off or expand in a high temperature manufacturing process.

Also, by using the adhesive member 350 having the first and second adhesive layers 352 and 353 that have different characteristics, the plastic substrate 110/210 can be effectively adhered at the supporting substrate 111/211, and the plastic substrate 110/210 can be effectively separated from the supporting substrate 111/211 after forming the desired thin film 100/200. Since the first adhesive layer 352 is adhered to the second adhesive layer 353 having the strong adherence with the adherence of the first adhesive layer 352 weakened at a low temperature, the plastic substrate 110/210 is clearly separated with no remainder.

Also, since the adherence of the first adhesive layer 352 according to an embodiment of the present invention becomes weakened at a low temperature, the plastic substrate 110/210 can be easily removed at a low temperature. Therefore, the transformation of the plastic substrate 110/210 caused by additional heating can be reduced because the supporting substrate 111/211 is not heated to remove the supporting substrate 111/211 from the plastic substrate 110/210.

In the exemplary embodiments of the present invention, the thin film is formed as a single layer. However, the thin film can be formed as a dual-layer or a triple-layer, unlike the embodiments of the present invention.

In the present exemplary embodiment, the present invention is described only for a liquid crystal display. However, it is obvious to those skilled in the art that the method of forming a thin film on a flexible substrate using an adhesive member by directly adhering two adhesive layers having different characteristics may apply to a method of manufacturing an organic light emitting diode (OLED) display.

The adhesive member according to an exemplary embodiment of the present invention includes the first and second adhesive layers and that have difference adherences and adherence characteristics that vary with a temperature with no interlayer included. Therefore, the plastic substrate adhered to the adhesive member does not come off or expand in a high temperature manufacturing process by the expansion or the contraction of the interlayer.

Also, the plastic substrate can be effectively adhered at the supporting substrate because the adhesive member includes the first and second adhesive layers that have different characteristics. Furthermore, the plastic substrate can be effectively separated from the supporting substrate after forming the desired thin film.

Herein, the plastic substrate can be clearly separated with no adhesive components remaining because the first adhesive layer is adhered to the second adhesive layer having the strong adherence with the adherence of the first adhesive layer weakened at a low temperature.

While this disclosure of invention has been provided in connection with what are considered to be practical exemplary embodiments, it is to be understood that the present teachings are not limited to the disclosed embodiments, but, on the contrary, they are intended to cover various modifications and equivalent arrangements included within the spirit and scope of the disclosure.

What is claimed is:

1. A method of manufacturing a liquid crystal display, comprising:
providing an adhesive member which comprises a first adhesive layer and a second adhesive layer, wherein the second adhesive layer has a first surface which is adhered directly to a surface of the first adhesive layer;
placing the first adhesive layer into adhering contact with one side of a flexible substrate;
placing the second adhesive layer into adhering contact with a supporting substrate;
after placing the first and second adhesive layers into respective adhering contacts with the flexible substrate and the supporting substrate, forming a plurality of thin films on a side of the flexible substrate which is not in contact with the first adhesive layer; and
after forming the thin films, separating the first adhesive layer from the flexible substrate while the first adhesive layer is kept within a predetermined temperature range,
wherein, within said predetermined temperature range, the adhesiveness of the second adhesive layer to the supporting substrate is substantially stronger than that of the first adhesive layer to the flexible substrate such that the flexible substrate with the thin films formed thereon can be separated in said separating step from the first adhesive layer while the second adhesive layer remains adhered to the supporting substrate,
wherein the predetermined temperature range of separation is about −10° C. to 5° C.;
wherein the adhesiveness of the first adhesive layer in a temperature range of about 20° C. to 50° C. is stronger than the adhesiveness of the first adhesive layer; and
wherein the adhesiveness of the second adhesive layer in the temperature range of about −10° C. to 150° C. is maintained stronger than the adhesiveness of the first adhesive layer in the temperature range of about −10° C. to 5° C.

2. The method of claim 1, further comprising
providing the first and second adhesive layers in combination with a first coating layer and a second coating layer covering the first adhesive layer and the second adhesive layer respectively, and further wherein a level of adhesiveness is stronger between the first adhesive layer and the second adhesive layer than those between the first adhesive layer and the second adhesive layer and their respective coating layers.

3. The method of claim 1, wherein said placing of the first adhesive layer into adhering contact with one side of a flexible substrate comprises:
providing the adhesive member adjacent to the flexible substrate;
applying pressure to thereby pressure bond the flexible substrate and the adhesive member and thus attach each to the other,
wherein said pressure applying step is carried out with use of a plurality of rolling rollers opposingly disposed on resulting top and bottom surfaces of the combination of the adjacent to each other flexible substrate and adhesive member, and wherein in said pressure applying step, said rollers are rotating in opposite directions to each other.

4. The method of claim 3, wherein the temperature of the rollers is maintained in the range of about 20° C. to 50° C. during said pressure bonding of the flexible substrate to the adhesive member.

5. The method of claim 1, further comprising,
bringing the adhesive member and the supporting substrate adjacent to one another;
applying pressure to opposed areas on the brought together supporting substrate and adhesive member and thus pressure wise attaching them to each other, where the pressure wise attaching step includes using rolling rollers respectively disposed on top and bottom surfaces of the brought together supporting substrate and adhesive member, where said rollers are rotating in opposite directions to each other during the pressure wise attaching step.

6. The method of claim 1, wherein, prior to the removing of the adhesive member from the flexible substrate, the flexible substrate is kept at a temperature above 5° C.

7. The method of claim 6, wherein, for the removing of the adhesive member from the flexible substrate, the flexible substrate is cooled to a temperature of about −10° C. to 5° C.

8. The method of claim 1, wherein the plurality of thin films formed on the flexible substrate define:
a gate line having a gate electrode;
a gate insulating layer formed on the gate line;
a semiconductor layer formed on a predetermined region of the gate insulating layer;
a data line formed on the gate insulating layer and the semiconductor layer and including a source electrode;
a drain electrode separated from the source electrode at a predetermined distance to face the source electrode; and
a pixel electrode formed on the data line and the drain electrode and connected to the drain electrode through a passivation layer having a contact hole defined therethrough.

9. The method of claim 1, wherein the plurality of thin films formed on the flexible substrate define:
a light blocking member;
a color filter; and
a common electrode.

10. A method of manufacturing a liquid crystal display, comprising:
providing an adhesive member having first and second adhesive layers bonded to one another and having respective first and second removable coating layers attached respectively to exterior surfaces of the first and second adhesive layers;
removing the removable first coating layer to thereby expose the exterior surface of the first adhesive layer;
placing the exposed exterior surface of the first adhesive layer on one side of a flexible substrate and bonding the exposed exterior surface of the first adhesive layer to the flexible substrate as a first lamination process;
after bonding the first adhesive layer to the flexible substrate, removing the removable second coating layer to thereby expose the exterior surface of the second adhesive layer;
placing the exposed exterior surface of the second adhesive layer on one side of a supporting substrate, and bonding the exposed exterior surface of the second adhesive layer to the supporting substrate as a second lamination process;
after bonding the second adhesive layer to the supporting substrate, forming a plurality of thin films on the other side of the flexible substrate which is not in contact with the first adhesive layer; and
after forming the plurality of thin films, separating the first adhesive layer from the flexible substrate,
wherein the predetermined temperature range of separation is about −10° C. to 5° C.;

wherein the adhesiveness of the first adhesive layer in a temperature range of about 20° C. to 50° C. is stronger than the adhesiveness of the first adhesive layer; and wherein the adhesiveness of the second adhesive layer in the temperature range of about −10° C. to 150° C. is maintained stronger than the adhesiveness of the first adhesive layer in the temperature range of about −10° C. to 5° C.

* * * * *